(12) United States Patent
Gao

(10) Patent No.: US 11,864,305 B2
(45) Date of Patent: Jan. 2, 2024

(54) CONNECTOR MODULE WITH MOBILE PLATE FOR SERVERS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 36 days.

(21) Appl. No.: 17/474,570

(22) Filed: Sep. 14, 2021

(65) Prior Publication Data
US 2023/0085165 A1    Mar. 16, 2023

(51) Int. Cl.
*H05K 7/20* (2006.01)
*H05K 7/14* (2006.01)

(52) U.S. Cl.
CPC ....... *H05K 7/20272* (2013.01); *H05K 7/1489* (2013.01); *H05K 7/20254* (2013.01); *H05K 7/20781* (2013.01)

(58) Field of Classification Search
CPC ........... H05K 7/20272; H05K 7/20254; H05K 7/20781; H05K 7/1489; H05K 7/20281; H05K 7/20772; H05K 7/20836; H05K 7/14; G06F 1/20; G06F 1/203; G06F 1/206
See application file for complete search history.

(56) References Cited

U.S. PATENT DOCUMENTS

| | | | | |
|---|---|---|---|---|
| 7,187,549 B2* | 3/2007 | Teneketges | ........... | H01L 23/473 361/689 |
| 7,639,499 B1* | 12/2009 | Campbell | .......... | H05K 7/20772 165/104.19 |
| 8,824,147 B2* | 9/2014 | Caron | ................ | H05K 7/20636 174/547 |
| 9,101,079 B2* | 8/2015 | Aoki | ...................... | H01L 23/467 |
| 2011/0069454 A1* | 3/2011 | Campbell | ............ | H05K 7/2079 361/699 |
| 2011/0313576 A1* | 12/2011 | Nicewonger | ...... | H05K 7/20781 361/701 |
| 2014/0238516 A1* | 8/2014 | Demange | ........... | H05K 7/20218 137/599.01 |
| 2017/0257980 A1* | 9/2017 | Fukunaga | ................ | F16L 37/40 |
| 2018/0242478 A1* | 8/2018 | Cui | ........................ | H01R 3/08 |
| 2018/0279510 A1* | 9/2018 | Johnson | ............. | H05K 7/20772 |
| 2019/0182984 A1* | 6/2019 | Chen | .................. | H05K 7/20772 |

* cited by examiner

*Primary Examiner* — Adrian S Wilson
*Assistant Examiner* — Gage Crum
(74) *Attorney, Agent, or Firm* — WOMBLE BOND DICKINSON (US) LLP

(57) ABSTRACT

A server chassis for a server rack can include a connector assembly. The connector assembly can include a first pair of connectors to fluidly connect to one or more cold plates that are thermally coupled to one or more electronic server components, and a second pair of connectors, to fluidly connect to a supply line and return line of the server rack. The connector assembly may further include a mobile plate upon which the second pair of connectors are attached to. The mobile plate may be attached as part of the connector assembly and movable to and from a direction that connects or disconnects the second pair of connectors to the supply line and the return line of the server rack.

20 Claims, 8 Drawing Sheets

(TOP VIEW)

(TOP VIEW)

(REAR VIEW)

(TOP VIEW)

(REAR VIEW)

CONNECTOR MODULE WITH MOBILE PLATE FOR SERVERS

FIELD

Embodiments of the present disclosure relate generally to electronics cooling for servers in a server rack. In particular, the connector assembly can have a mobile plate that helps to mate the connectors to rack fluid while being expandable and flexible to accommodate a varying number of servers in a single server chassis.

BACKGROUND

Information Technology (IT) includes technology such as computers that are accessible through the internet or a local network, which provide storage of, or access to, data, websites, computer programs, algorithms, services, and more. IT equipment such as servers and other electronic components (e.g., peripheral devices) can be installed in a server chassis. These server chassis can then be installed in a server rack, which may also be referred to as an IT rack.

A server rack can be populated with a plurality of server chassis, each server chassis housing one or more printed circuit board where the electronics components and integrated circuits are packaged. The server chassis can serve to manage power, thermal requirements, electronic connectivity, structural support, and other considerations of the IT equipment.

Liquid cooling for high power density electronics has increased in popularity because air cooling can be thermally insufficient in some circumstances. Liquid cooling allows for higher packaging density and increased computing load of electronics, by properly transferring the heat load generated by the electronics and at the same time, providing proper thermal environment.

A server rack may include a plurality of server chassis installed upon it. Some server chassis may have high-density components—multiple servers may be populated to and coexist in a single server chassis. Other server racks may have a single server. As such, the number and/or position of connectors from one server chassis to another in a server rack may vary based on the type or number of servers that are housed by the server chassis.

A server rack may include infrastructure to circulate fluid (e.g., a liquid coolant) to and from each of the server chassis that are populated within the server rack. Thus, it is desirable to have a system that can accommodate the various configurations of servers of each server chassis within a server rack.

Further, it is desirable for efficient installation, removal, and serviceability of each server chassis in the server rack, which may include fluidly connecting and/or disconnecting the server chassis from the server rack. Further, safeguards are desirable to prevent accidental or improper disconnection of fluid lines or of server equipment.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the present disclosure can address issues identified, such as accommodating various configurations of a server chassis in a flexible and modular manner; providing an efficient installation, removal, and serviceability of each server chassis in the server rack; and/or providing safeguards to prevent accidental or improper disconnection of fluid lines or of server equipment.

Generally, a connector assembly can attach to a server chassis that is to populate a server rack. The connector assembly may include a one or more first pair of connectors to fluidly connect to one or more cold plates that are thermally coupled to one or more electronic server components, and a second pair of connectors, to fluidly connect to a supply line and return line of the server rack. The connector assembly may further include a mobile plate upon which the second pair of connectors are attached to. The mobile plate may be attached to the connector assembly and movable to and from a direction that connects or disconnects the second pair of connectors to the supply line and the return line of the server rack.

The one or more first pair connectors can have various numbers of pairs of connectors to accommodate different server rack configurations. Further, the movable plate can mate the second pair of connectors with rack fluid connectors. In such a manner, the connector assembly can serve as an interface between the varying fluid connectors of the server components and fluid connectors of the server rack while providing an efficient manner in connecting and disconnecting a server chassis fluidly. Other features and embodiments are also described in the present disclosure.

Figure 1:
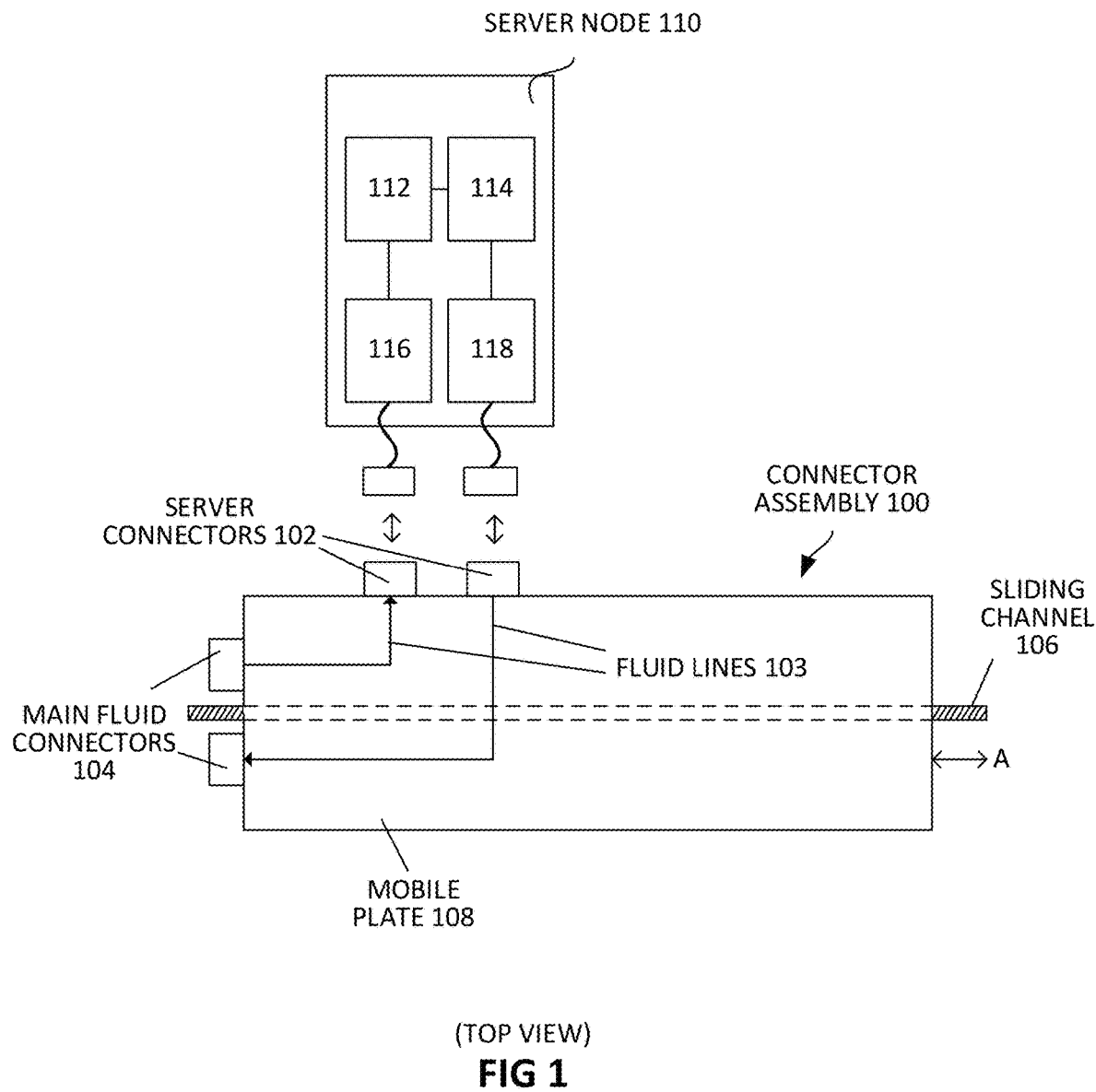
FIG. 1 shows a connector assembly with a mobile plate, according to some embodiments.

FIG. 1 shows a connector assembly with a mobile plate, according to some embodiments. A connector assembly 100 is shown that is to attach to a server chassis to populate a server rack. The connector assembly can include one or more first pair of connectors 102 to fluidly connect to one or more cold plates such as cold plates 112, 114, 116, and 118. The one or more cold plates are each thermally coupled to one or more electronic server components such as, for example, an integrated circuit (IC) which can be a surface mounted device (SMD) that is fixed to a printed circuit board (PCB). The one or more electronic server components can be grouped as a server node 110 to provide functionality, for example, of a network connected server. The one or more first pair of connectors can include a first connector that delivers fluid to the one or more cold plates, and a second connector that receives the fluid from the one or more cold plates, thus circulating fluid to and from the cold plates.

The connector assembly 100 includes a second pair of connectors 104 which can be understood as main fluid connectors, to fluidly connect to a supply line and return line of the server rack. The main fluid connectors can include a first connector that mates with a supply line connector and a second connector that mates with a return line connector. The supply line connector and return line connector can be fluid ports on a supply manifold and a return manifold of a server rack that the connector assembly and server chassis is installed upon. The connector assembly includes fluid lines 103 which can be rigid or flexible conduit or channels in a solid plate, that fluidly connect a) a first of the main fluid connectors 104 to a first of each of the server fluid connectors 102, and b) a second of the main fluid connectors 104 to a second of each of the server connectors 102.

The connector assembly 100 includes a mobile plate 108 upon which the second pair of connectors 104 are attached to. The mobile plate may be attached to the connector assembly and movable to and from a direction that connects or disconnects the second pair of connectors to the supply line and the return line of the server rack.

For example, the mobile plate can be pushed in a direction A that coincides with a mating direction of the second fluid connectors 104. Similarly, the mobile plate can be pulled in the direction A that coincides with a disconnecting direction of the second fluid connectors 104. The second fluid connectors can be blind mating connectors that mate when pushed together with a mating connector along the mating direction, and disconnect when pulled apart along the mating direction. Similarly, the one or more first pairs of fluid connectors can be blind mate connectors. In some embodiments, connectors 102, 104 and 102 can be manual mating connectors. As discussed in other sections, the connector assembly, including connectors 102 and 104, can be directly accessed by a user when installed on the server rack. Regardless of whether the connectors are blind mating or manual mating connectors, the connectors can be dripless connectors. Blind mate connectors can include spring-loaded connection mechanisms that allow for automatic mating based on applied force. Dripless connectors can include spring-loaded valves that automatically cut off fluid flow when disconnected.

In some aspects, the mobile plate is attached to a sliding channel 106 of the connector assembly that provides movement of the mobile plate in the direction that connects or disconnects the second pair of connectors from the supply line and return line. For example, the mobile plate can include one or more members that reside in the sliding channel to hold the mobile plate to the connector assembly and also allow it to move back and forth within the sliding channel. Additionally, or alternatively, the connector assembly can include other sliding hardware such as a ball-bearing slide or one or more armatures that can attached the mobile plate to the connector assembly in a movable manner to provide a consistent back and forth movement. The sliding channel or other sliding hardware can be attached to a connector frame, as described in other sections.

As shown in FIG. 1, the first pair of connectors 102 may be fixed upon and slide with the mobile plate. In such a case, the connectors from the server node 110 that mate with the first pair of connectors may be attached on flexible fluid lines that can move with the mobile plate when the mobile plate is moved. Under this embodiment, these server nodes may not be directly blind mated with a pair of the first connectors, because the flexible fluid lines of the server node may not provide enough force to the connectors to mate with the pair of first connectors. A user can mate connectors by holding each connector and joining them, rather than push the server node against the connector assembly.

In some embodiments, the one or more first pair of connectors do not move with the mobile plate. Instead, they are fixed to a stationary member. In such a case, the server nodes may be pushed against the connector assembly in a blind mating operation, as described in other sections.

Figure 2:
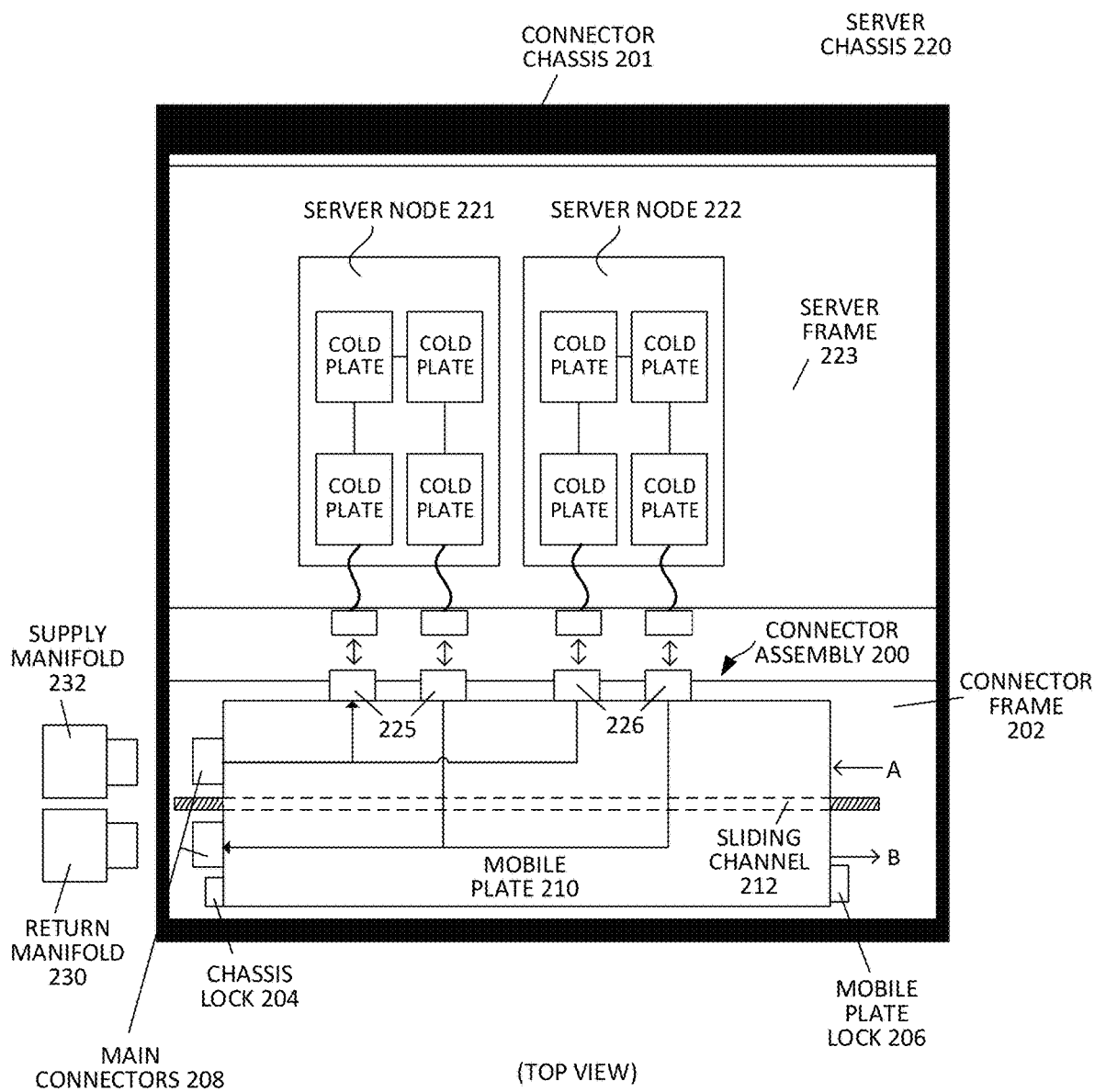
FIG. 2 shows a server chassis with a connector assembly having a mobile plate, according to some embodiments.

FIG. 2 shows a server chassis 220 with a connector assembly 200 having a mobile plate, according to some embodiments. The connector assembly 200 can include a connector frame 202 that is attached to a connector chassis 201. A server frame 223 may attach upon the connector chassis 201 to form the server chassis 220. The server frame 223 can have attached to it one or more groupings of the one or more electronic server components and the one or more cold plates. For example, the one or more electronic server components and cold plates can be grouped in a first server node 221 and a second server node 222.

The electronic server components of the first server node can work together to serve as an integrated server solution that is connected to a network. Similarly, the electronic server components of the second server node can work together to serve as a separate integrated server solution that is connected to the network. Thus, each server node can perform dedicated operations independent of other server nodes. A single server chassis may house various arrangements of server nodes, thus providing a flexible and high-density computing platform. In an embodiment, one server node may include two sets of connectors.

A user (e.g., a technician) can assemble the mobile plate 210 onto a connector frame 202 in a movable manner, such as by attaching the mobile plate 210 to one or more sliding channels 212. The sliding channel or other sliding hardware can be integrated with or attached to connector frame 202. The connector frame can be attached to a connector chassis 201 which serves as an overall frame for the server chassis 220. A desired arrangement of server nodes (e.g., 221, 222) can be assembled onto the server frame 223 which can then be attached to the connector chassis 201 to form the server chassis 220. The fluid connector pairs of each server node can be attached to the respective server fluid connector pairs of the connector assembly. In FIG. 2, for example, server connectors 225, 226 can be dripless manual mating connectors. Connectors 225, 226 can mate with connectors of server node 221 and 222 respectively. Those connectors of server node 221 and 222 may be attached to the cold plates with flexible fluid lines. Thus, connection and disconnection of connectors 225, 226 from the connectors of the server nodes may be performed manually from a rear portion of the server rack, as described in other sections. Blind mating connectors can be understood as connectors that can connect and disconnect without direct access. Manual mating connectors can be understood as connectors that are mated together through some manipulation that may be performed manually, for example, by joining, twisting, or other manipulation, performed by hand.

After the server chassis 220 is installed in place within the server rack, the user can slide the mobile plate 210 in the mating direction A. The second pair of connectors (e.g., main connectors) 208 can mate with respective connectors on the supply manifold 232 and the return manifold 230. Once mated, the user can place the mobile plate lock 206 into a locked position to hold the mobile plate 210 fixed in the mated position with the supply and return manifold. Further, the user can place a chassis lock 204 into a locked position to hold the entire server chassis fixed in its position within the server rack. The chassis lock and mobile plate lock can each include locking hardware such as a latch, hook, ledge, pin/hole, clip, armature, spring, and/or other locking hardware or combination thereof as further described in other sections.

Figure 3A:
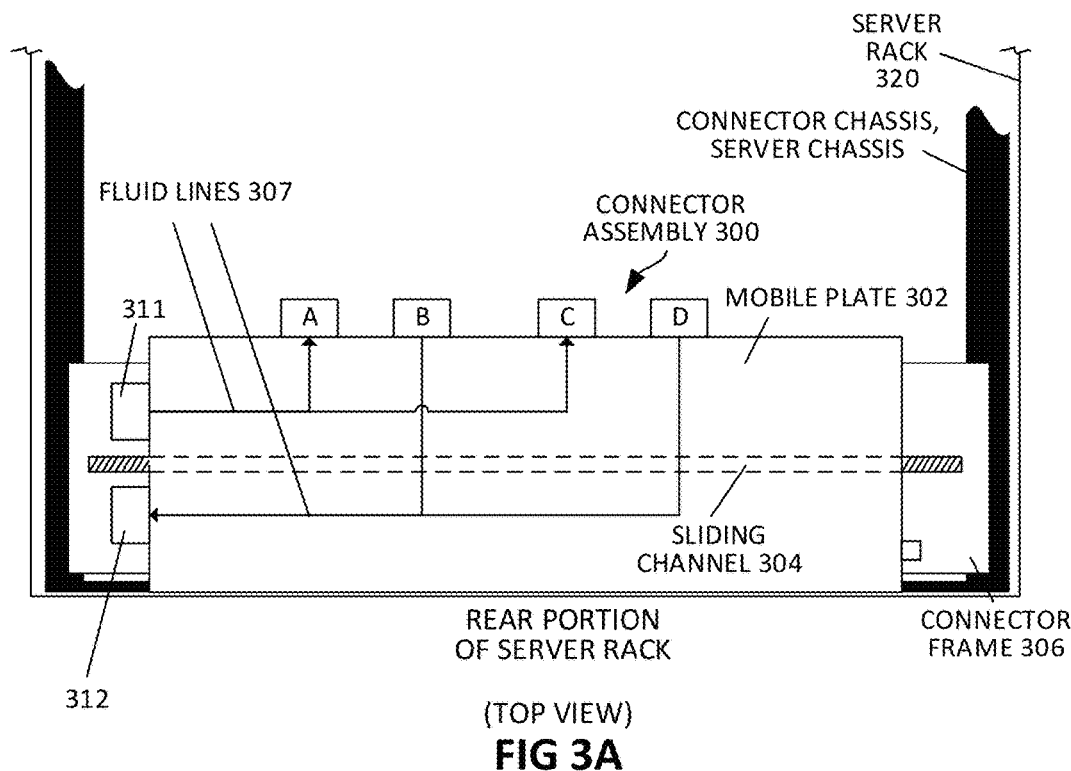
FIG. 3A and FIG. 3B shows a connector assembly with mobile plate and movable main connectors, according to some embodiments.
Figure 3B:
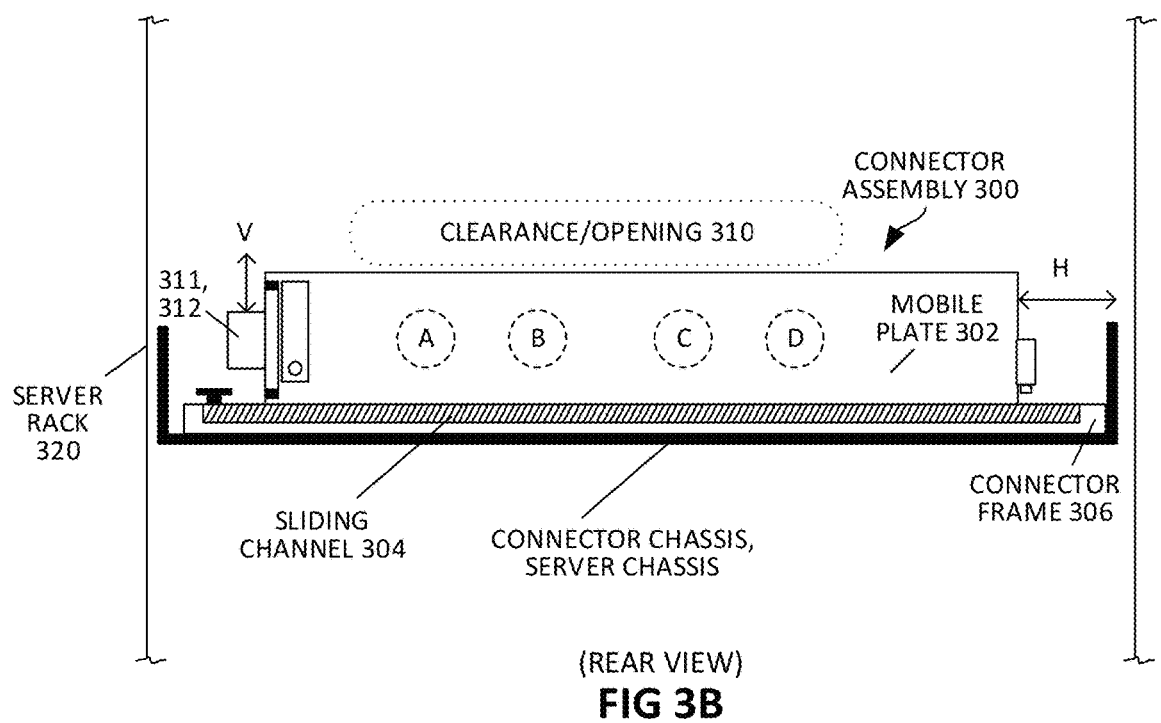

FIG. 3A and FIG. 3B shows a connector assembly 300 with mobile plate 302 and movable second pair of connectors (e.g., main connectors), according to some embodiments. Fluid lines 307 can fluidly connect second pair of connectors 311, 312 to first connector pairs A, B and C, D (e.g., server connectors) to circulate fluid to respective server nodes once the server nodes are connected to the server connectors. The fluid lines 307 can be collectively referred to as a distribution unit. The fluid lines can be integrated as part of the mobile plate 302 as shown in this example, such that they move with the mobile plate.

The second pair of connectors (311,312) which can be understood as main connectors, can be movable in a direction perpendicular to the direction that connects or disconnects the second pair of connectors. For example, when the connector assembly is installed in the server rack, the mobile plate 302 may move back and forth along a horizontal direction 'H' relative to the server rack to mate the second pair of connectors with the supply line and return line connectors of the server rack. The connectors, however, may not perfectly line up with each other. As such, the second pair of connectors can be movable up or down along direction V to precisely mate the second pair of connectors to the supply line and return line connectors. This movement can adjust for slight mismatches between the physical dimensions of the server rack and the server chassis. In an embodiment, the 312 and 311 may be moveable in a perpendicular direction to the V direction, different from the connect and disconnect direction, in FIG. 3B to be more flexible to accommodate actual use cases.

In some embodiments, as shown in FIG. 3A, the connector assembly is to occupy a rear portion of the server chassis such that the mobile plate is unimpeded at a rear portion of the server rack 320 when the server chassis is installed in the server rack. In such a manner, a user may access the mobile portion of the connector assembly to mate the main connectors, and access one or more locking kits, as described in other sections.

In some embodiments, the connector assembly includes a serviceable opening 310 above the mobile plate at the rear portion of the server rack. A serviceable opening can be an unimpeded opening that allows a user's hand to pass through. The opening may allow the operator to access the connectors and engage the connector connection. The opening can be adjacent to the pairs of first fluid connectors such as A, B and C, D to allow a user to reach each of the pairs of first fluid connectors for connecting or disconnecting connectors of a server node to server connectors of the connector assembly. This can be especially useful if the pairs of first fluid connectors are fixed to the movable plate as shown because the connectors of the server modules that fluidly connect to the movable plate can be on flexible lines which makes blind mating impractical. As such, a user may reach through the opening 310 to connect or disconnect the servers from the pairs of first fluid connectors. The opening can, in some embodiments, be designed into the mobile plate 302 or an opening on another port of the connector assembly 300.

Mobile plate 302 can be attached to connector frame 306 through a sliding channel 304 of the connector frame. As described, the connector assembly can include other sliding hardware to attach the mobile plate to the connector assembly in a movable manner.

In figures of the present disclosure, some components such as the server frame and server nodes here, have been omitted for simplicity. Further, it should be understood that the connector chassis, server chassis, connector frame, and server frame as described in the present disclosure are simplified in many respects and hardware can vary without departing from the scope of the present disclosure. A chassis or frame such as the server chassis, connector chassis, connector frame, or server frame, can be understood as a structure that may include one or more members such as plates, sheet metal, bars, brackets, pads, and other mechanical members that may be joined to form a rigid structure onto which electronic components of a server and other supporting components can be mounted upon. Other supporting components can include electrical connectors, electrical harnesses, fluid connectors, fluid lines, power supplies, fans, cold plates, and other supporting components.

Figure 4A:
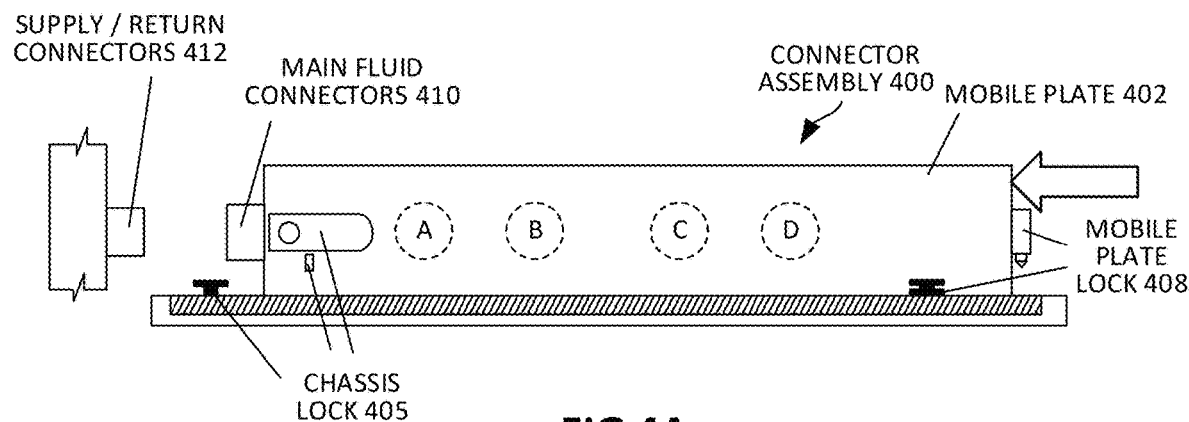
FIG. 4A and FIG. 4B shows a mobile plate in connected and disconnected position, according to some embodiments.
Figure 4B:
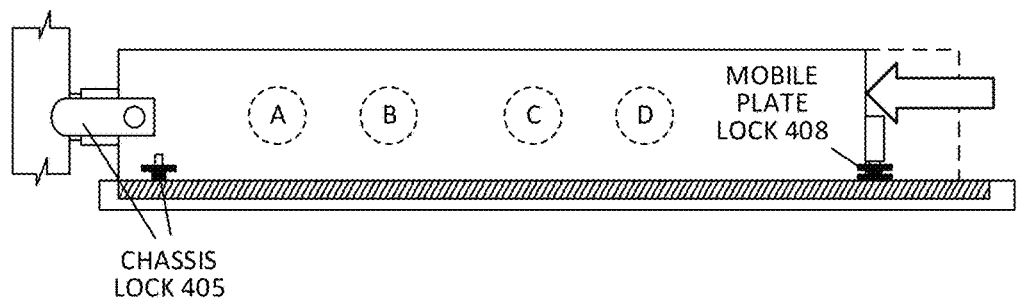

FIG. 4A and FIG. 4B shows a mobile plate 402 in disconnected and connected positions respectively, according to some embodiments. A connector assembly 400 can include a first lock 408 and a second lock 405. The first lock 408 is to hold the mobile plate fixed in place when the second pair of connectors are fluidly connected to the supply line and the return line. The first lock can be understood as a mobile plate lock. In some embodiments, the first lock can include a pin or latch that fits to a latch, hole, or other structure to fix the mobile plate in place and prevent inadvertent disconnection of the main fluid connectors 410 and supply connectors 412.

Additionally, or alternatively, the connector assembly can include a second lock 405 that is to hold the server chassis fixed in place in the server rack. The second lock 405 can be understood as a chassis lock. In some embodiments, the second lock 405 can be moved to a lock position by rotating a lock member (e.g., 180 degrees) so that the lock member impedes movement of the server chassis from being pulled out of the server rack.

In some embodiments. the first lock or the second lock can be a lock kit that includes locking hardware such as a latch, hook, ledge, pin/hole, clip, armature, spring, and/or other locking hardware or combination thereof.

A user can populate the server chassis to a server rack. Once populated, the user can move mobile plate 402 so that the main fluid connectors 410 which are attached to the mobile plate mate with corresponding supply/return connectors 412 of the server rack. The user can lock the first lock 408 to lock the mobile plate in place so that the main fluid connectors do not inadvertently disconnect. Further, the user can lock the second lock 405 so that the server chassis is not pulled out inadvertently without first disconnecting the fluid connectors.

For example, the second lock 405 and first lock 408 may both be located at the rear region of the server rack. To remove the server chassis, the user may walk to the rear region of the server rack, unlock the first lock 408, unlock the second lock 405, move the mobile plate to disconnect the main fluid connectors from the supply/return connectors, and then walk towards the front of the server rack to remove the server chassis from the server rack. Thus, the locks provide a structured workflow that help to reduce error that can damage equipment.

Figure 5:
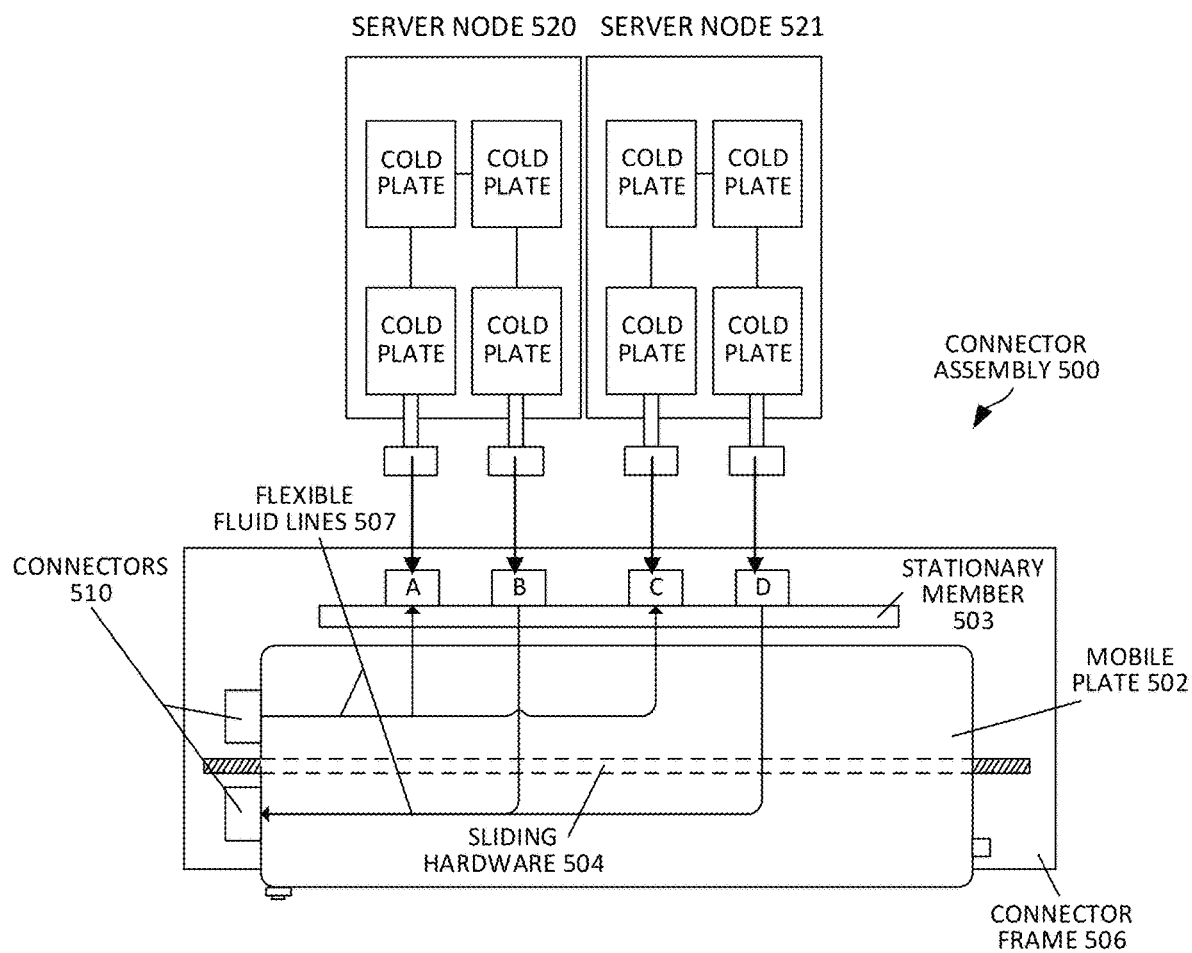
FIG. 5 shows a connector assembly with a mobile plate having fixed server fluid connectors, according to some embodiments.

FIG. 5 shows a connector assembly 500 with a mobile plate having fixed server fluid connectors, according to some embodiments. The connectors assembly can include one or more first pairs of connectors (e.g., A, B, and C, D) that are fixed upon a stationary member 503 of the connector assembly. The first pairs of connectors can be understood as server connectors that mate with connectors of a server node. The stationary member can include a bracket, plate, or other rigid structure. The stationary member can be fixed to connector frame 506 on which the mobile plate is attached to. Flexible fluid lines 507 can fluidly connect the one or more first pairs of connectors to the mobile plate or to second pair of connectors 510. The flexible fluid lines can be understood as a distribution unit.

In such a manner, server nodes such as 520 and 521 can have connectors that are rigidly attached to each server node and can mate with the respective pair of first connectors by with a push. Similarly, the server nodes and connectors can be disconnected with a pull. Thus, this arrangement can allow for blind mating of each server node to the connector assembly. Mobile plate 502 can be attached to connector frame 506 with sliding hardware 504 as discussed in other sections. When the mobile plate 502 moves to mate the second pair of connectors 510, the flexible fluid lines 507 can flex while each of the one or more first pairs of connectors A, B, C, and D remain in place. Thus, the server nodes can have rigid fluid connectors to allow blind mate connection and disconnection to and from the connector assembly for efficient installation and servicing.

Figure 6A:
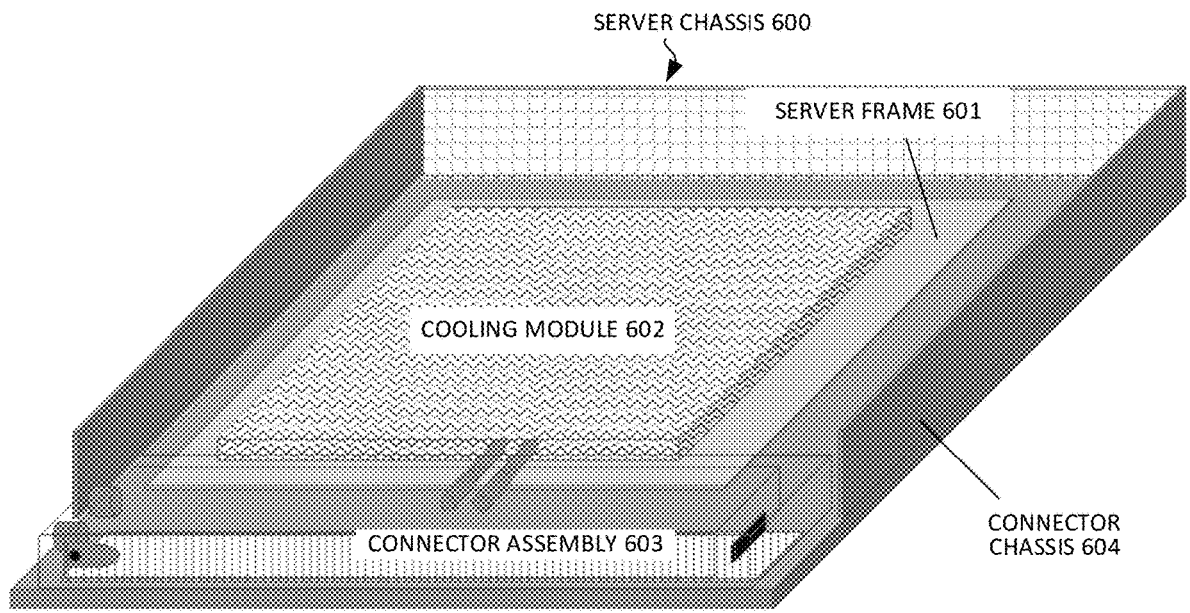
FIGS. 6A and 6B show an example of a server chassis that includes a connector chassis and removable server frame, according to some embodiments.
Figure 6B:
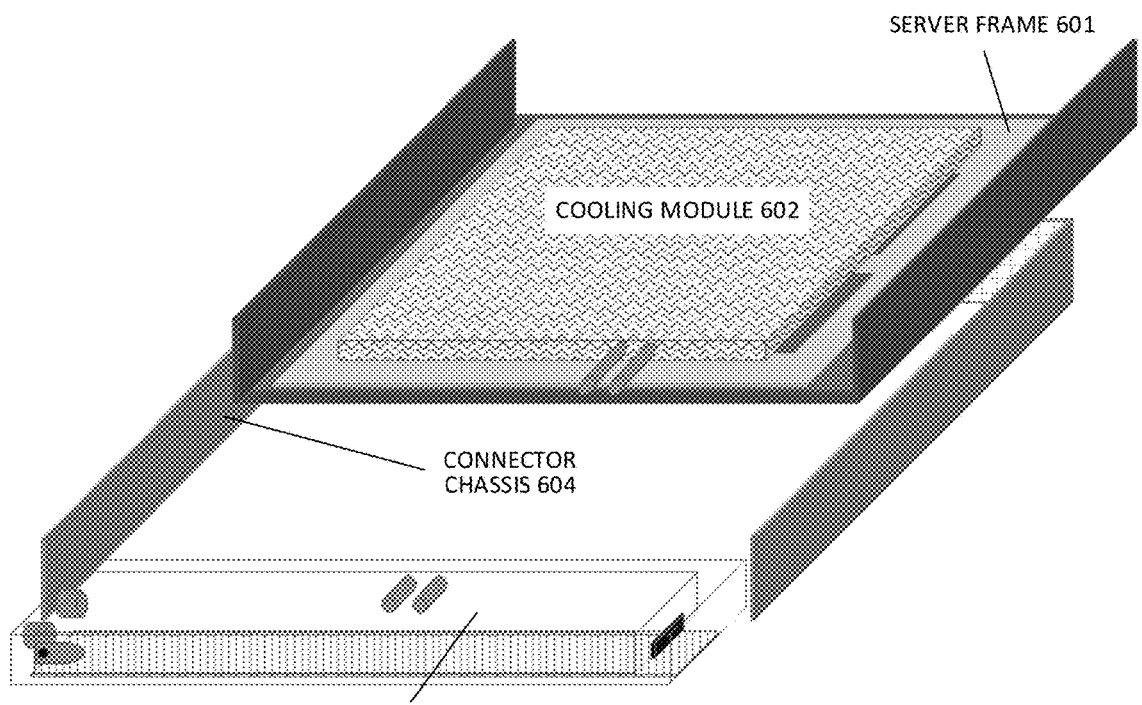

FIGS. 6A and 6B show an example of a server chassis 600 that includes a connector chassis 604 and removable server frame 601, according to some embodiments. The server frame can include electronic components such as ICs mounted on a PCB, as well as other components.

Further, the server frame can include a cooling module 602 that can include one or more cold plates, fluid lines, and connectors that are fluidly connected to the one or more cold plates. The server frame 601 can attach to the connector chassis 604 on which the connector assembly 603 is attached. Fluid connectors of the cooling module can connect to the connector assembly. The connector assembly 603 can include any of the embodiments described in other sections. In such a manner, a server chassis is made modular—a server frame such as server frame 601 can be removed and replaced with a different server frame that can include more server nodes.

Figure 7:
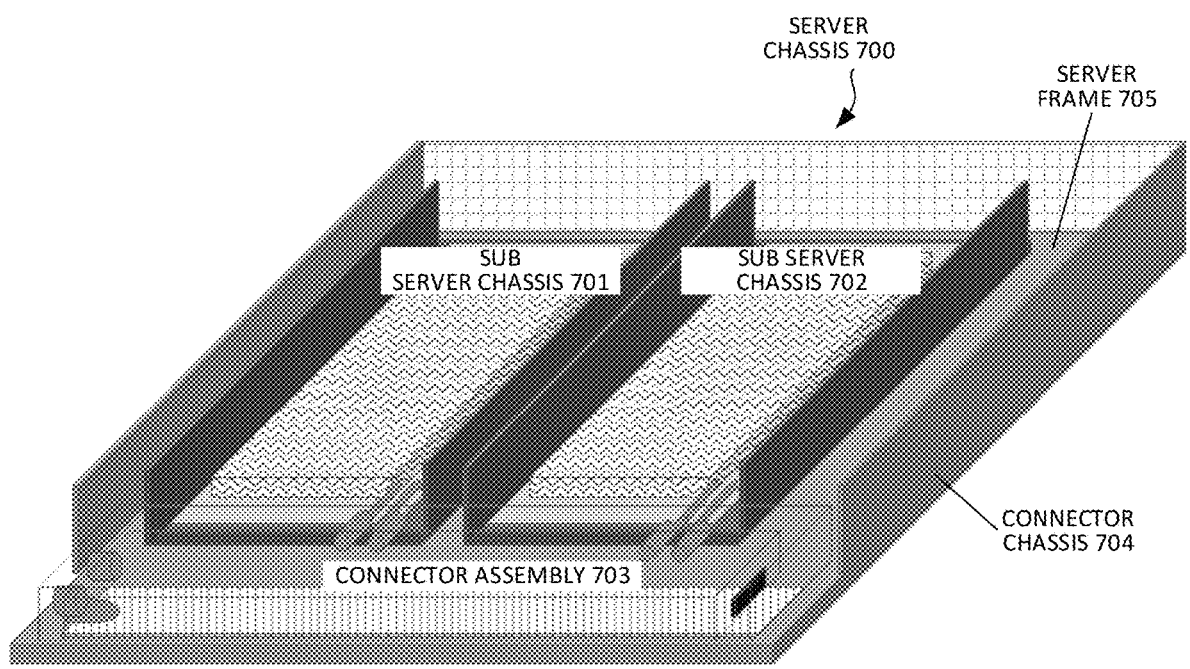
FIG. 7 shows an example of a server chassis with a plurality of sub server chassis, according to some embodiments.

FIG. 7 shows an example of a server chassis 700 with a plurality of sub server chassis, according to some embodiments. Server chassis 700 can include a connector assembly 703 that is attached to a connector chassis 704. A server frame 705 also attaches upon the connector chasses. Collectively, the parts are assembled to form the server chassis 700. Further the server frame 705 can have one or more groupings of electronic server components and cold plates which can be each be referred to as a server node. Each server node can reside on a respective sub-server chassis such as 701 and 702.

To assemble a server chassis, a user can populate a server frame in a desired manner which can vary, for example, by the type or number of server nodes attached. The user can attach the server frame to the connector chassis and fluidly connect each server node to the one or more pairs of server fluid connectors, as described in other sections. The resulting server chassis can then be populated to a server rack, and the mobile plate of the server rack can be moved into position to connect the main fluid connectors to the supply line and return line of the server rack. The mobile plate and the server rack can be locked in place.

Thus, as shown in FIG. 6 and FIG. 7, the connector assembly allows for an efficient and flexible architecture at the server chassis level, to fluidly connect each server chassis to the server rack, while also providing safety measures to protect the electronic equipment. The design of the connector assembly can be also configured differently to accommodate different scenarios, including, a sub server chassis requires two or more sets of connectors, different numbers of the server chassis, different server chassis requires different types of connectors, and different server chassis populated on top of each other within a server frame.

Figure 8:
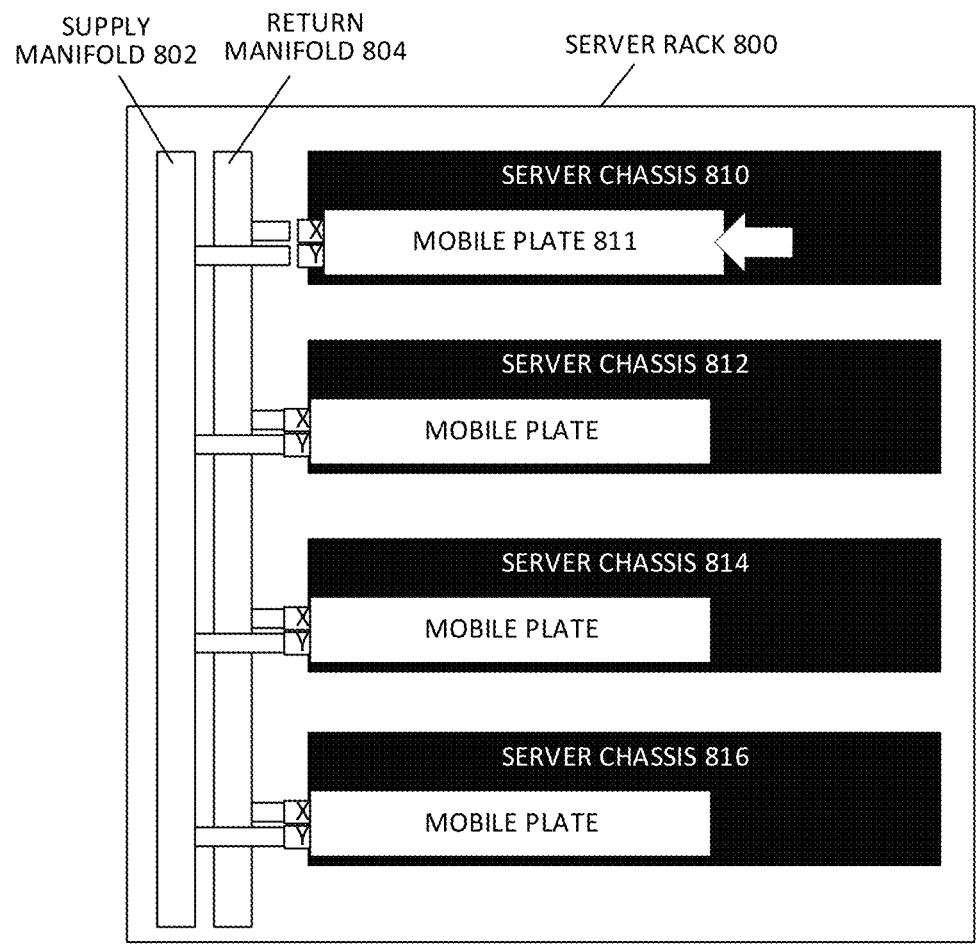
FIG. 8 shows an example of a server rack with a plurality of server chassis, according to some embodiments.

FIG. 8 shows an example of a server rack 800 with a plurality of server chassis, according to some embodiments. Server rack 800 can include a plurality of server chassis such as 810, 812, 814, and 816 that are populated to the server rack. Each of the server chassis can have a mobile plate that moves to connect or disconnect its main fluid connectors X, Y with respective mating connectors on a fluid supply line 802 and a fluid return line 804. The fluid supply line can be understood as a fluid supply manifold having a plurality of connectors as fluid ports. Similarly, the fluid return line 804 can be understood as a fluid return manifold having a plurality of connectors as fluid ports.

The fluid supply manifold can serve as a centralized fluid distribution point within the server rack to circulate fluid to each of the server chassis. Similarly, the fluid return manifold can serve as a centralized fluid collection point within the server rack to collect fluid from each of the serer chassis. Manifolds can reduce the number of fluid lines and connectors within a system by using a common structure (e.g., a shared fluid channel) for distribution or collection of fluid.

The mobile plate 811 of server chassis 810 is shown in the disconnected position. A user can fluidly connect server components housed in server chassis 810 to the supply line and return line by moving mobile plate 811 towards the connectors of the supply line and return line. Server chassis 812, 814, and 816 are shown with mobile plates moved in the fluid connected position. As such, server components housed in server chassis 812, 814, and 816 are fluidly connected to the supply line and return line of the server rack. Although not shown, the server rack can fluidly connect to an external fluid supply source that can include a pump, a fluid cooler, and/or other fluid components. Similarly, some components such as, for example, those of the connector assembly, are omitted here for illustration purposes.

Furthermore, although not shown, a server rack can, in some embodiments, include various other supporting components. For example, a server rack can include a cooling distribution unit (CDU), a rack management unit (RMU). The server chassis can also be referred to as a server blade that can be inserted into an array of server slots respectively from frontend or backend of the server rack. A server rack can be either open to the environment or partially contained by a rack container. The server rack can include one or more cooling fans that can generate airflow from a frontend to a backend of the server rack. In some embodiments, a server rack may include a cooling fan for each server chassis. The cooling fans may be mounted on each server chassis to generate airflow through the server chassis. In some embodiments, the CDU can include a heat exchanger, liquid pump, a pump controller, a fluid reservoir, a power supply, sensors and more. The CDU's heat exchanger may be a liquid-to-liquid heat exchanger that includes a first loop with inlet and outlet ports having a first pair of liquid connectors coupled to external liquid supply/return lines to form a primary loop. The liquid supply/return lines may be fluidly connected to a set of room manifolds, which may be coupled to an external heat removal system, or external cooling loop. In addition, the heat exchanger may further include a second loop with two ports having a second pair of liquid connectors coupled to the fluid manifold to form a secondary loop that fluidly supplies and returns fluid between one or more server chassis and the CDU.

Each of the server chassis may house one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to the bottom of any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

A server rack may further include an optional RMU configured to provide and manage power supplied to servers, fan modules, and the CDU. The RMU may be coupled to a power supply unit to manage the power consumption of the power supply unit. The power supply unit may include the necessary circuitry (e.g., an alternating current (AC) to direct current (DC) or DC to DC power converter, backup battery, transformer, or regulator, etc.) to provide power to the rest of the components of the server rack.

Aspects of the cooling distribution system can be flexible and deployable in different system architectures; for example, the system can be deployed with a localized pumping system (e.g., a closed system architecture) or central pumping system (e.g., an open system architecture). Aspects described can simultaneously separate IT equipment from leaked fluid and direct leaked fluid to pool in a common location for detection, thereby minimizing the impact of a fluid leak and increasing overall system reliability.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A connector assembly that is to attach to a server chassis to populate a server rack, the connector assembly comprising:
   a first pair of connectors to fluidly connect to cold plate connectors which are fluidly connected to one or more cold plates that are thermally coupled to one or more electronic server components;
   a second pair of connectors that are fluidly connected to the first pair of connectors through fluid lines, the second pair of connectors being aligned in a direction that is orthogonal to the first pair of connectors to fluidly connect to a supply line and return line of the server rack; and
   a mobile plate upon which the second pair of connectors are attached to, the mobile plate being attached to a sliding channel of the connector assembly to make the mobile plate movable to and from the direction that connects or disconnects the second pair of connectors to the supply line and the return line of the server rack and wherein the connector assembly includes an serviceable opening above the mobile plate.

2. The connector assembly of claim 1, wherein the first pair of connectors are fixed upon and slide with the mobile plate.

3. The connector assembly of claim 1, wherein the first pair of connectors are fixed upon a stationary member of the connector assembly and are fluidly connected to the mobile plate with flexible conduit.

4. The connector assembly of claim 1, further comprising a first lock that is to hold the mobile plate fixed in place when the second pair of connectors are fluidly connected to the supply line and the return line.

5. The connector assembly of claim 1, further comprising a second lock that is to hold the server chassis fixed in place in the server rack.

6. The connector assembly of claim 1, wherein the connector assembly is attached to a connector chassis that a server frame attach upon to form the server chassis, the server frame having attached to it one or more groupings of the one or more electronic server components and the one or more cold plates.

7. The connector assembly of claim 1, wherein the second pair of connectors are movable in a second direction different from the direction that connects or disconnects the second pair of connectors and the mobile plate is to move back and forth along a horizontal direction relative to the server rack.

8. The connector assembly of claim 1, wherein the mobile plate is attached to the sliding channel of the connector assembly through hardware including a ball-bearing slide or an armature that provides a back and forth movement along the direction.

9. The connector assembly of claim 1, wherein the connector assembly is to occupy a rear portion of the server chassis.

10. The connector assembly of claim 9, wherein the serviceable opening above the mobile plate is positioned at the rear portion of the server rack.

11. A server rack, comprising:
a plurality of server chassis; and
a connector assembly, attached to each of the plurality of server chassis, the connector assembly including:
a first pair of connectors to fluidly connect to cold plate connectors which are fluidly connected to one or more cold plates that are thermally coupled to one or more electronic server components;
a second pair of connectors that are fluidly connected to the first pair of connectors through fluid lines, the second pair of connectors being aligned in a direction that is orthogonal to the first pair of connectors to fluidly connect to a supply line and return line of the server rack; and
a mobile plate upon which the second pair of connectors are attached to, the mobile plate being attached to a sliding channel of the connector assembly to make the mobile plate movable on the connector assembly, to and from the direction that connects or disconnects the second pair of connectors to the supply line and the return line of the server rack.

12. The server rack of claim 11, wherein the first pair of connectors are fixed upon and slide with the mobile plate.

13. The server rack of claim 11, wherein the first pair of connectors are fixed upon a stationary member of the connector assembly and are fluidly connected to the mobile plate with flexible conduit.

14. The server rack of claim 11, wherein the connector assembly further comprises a first lock that is to hold the mobile plate fixed in place when the second pair of connectors are fluidly connected to the supply line and the return line.

15. The server rack of claim 11, wherein the connector assembly further comprises a second lock that is to hold the server chassis fixed in place in the server rack.

16. A data center comprising:
a plurality of server racks, one or more of the server racks including:
a plurality of server chassis; and
a connector assembly, attached to each of the plurality of server chassis, the connector assembly including:
a first pair of connectors to fluidly connect to cold plate connectors which are fluidly connected to one or more cold plates that are thermally coupled to one or more electronic server components;
a second pair of connectors that are fluidly connected to the first pair of connectors through fluid lines, the second pair of connectors being aligned in a direction that is orthogonal to the first pair of connectors to fluidly connect to a supply line and return line of the server rack; and
a mobile plate upon which the second pair of connectors are attached to, the mobile plate being attached to a sliding channel of the connector assembly to make the mobile plate movable to and from the direction that connects or disconnects the second pair of connectors to the supply line and the return line of the server rack.

17. The data center of claim 16, wherein the first pair of connectors are fixed upon and slide with the mobile plate.

18. The data center of claim 16, wherein the first pair of connectors are fixed upon a stationary member of the connector assembly and are fluidly connected to the mobile plate with flexible conduit.

19. The data center of claim 16, wherein the connector assembly further comprises a first lock that is to hold the mobile plate fixed in place when the second pair of connectors are fluidly connected to the supply line and the return line.

20. The data center of claim 16, wherein the connector assembly further comprises a second lock that is to hold the server chassis fixed in place in the server rack.

* * * * *